United States Patent
Sio et al.

(10) Patent No.: US 12,255,203 B2
(45) Date of Patent: Mar. 18, 2025

(54) MONOLITHIC THREE DIMENSIONAL INTEGRATED CIRCUIT

(71) Applicant: Taiwan Semiconductor Manufacturing Company, Ltd., Hsinchu (TW)

(72) Inventors: Kam-Tou Sio, Zhubei (TW); Jiann-Tyng Tzeng, Hsinchu (TW); Shih-Wei Peng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/245,757

(22) Filed: Apr. 30, 2021

(65) Prior Publication Data

US 2022/0352148 A1 Nov. 3, 2022

(51) Int. Cl.
*H01L 27/06* (2006.01)
*H01L 21/822* (2006.01)
*H01L 23/522* (2006.01)
*H01L 23/528* (2006.01)

(52) U.S. Cl.
CPC ...... *H01L 27/0688* (2013.01); *H01L 21/8221* (2013.01); *H01L 23/5226* (2013.01); *H01L 23/528* (2013.01)

(58) Field of Classification Search
CPC . H01L 23/5226; H01L 23/528; H01L 23/522; H01L 21/8221; H01L 27/0688; H01L 27/0207

See application file for complete search history.

(56) References Cited

U.S. PATENT DOCUMENTS

| | | | |
|---|---|---|---|
| 2009/0160012 A1* | 6/2009 | Kim ............... | H01L 27/0688 257/E21.586 |
| 2014/0264915 A1* | 9/2014 | Huang ............ | H01L 25/18 257/774 |
| 2015/0155233 A1* | 6/2015 | Han ............... | H01L 23/481 257/774 |
| 2015/0235949 A1* | 8/2015 | Yu ................. | H01L 25/0652 257/774 |
| 2017/0365600 A1* | 12/2017 | Sinha ............. | H01L 24/73 |
| 2018/0159203 A1* | 6/2018 | Baks .............. | H01Q 1/48 |
| 2019/0363087 A1* | 11/2019 | Zhou .............. | H01L 27/108 |
| 2020/0211642 A1* | 7/2020 | Huynh Bao ..... | G11C 14/009 |
| 2020/0388567 A1* | 12/2020 | Mignot ........... | H01L 21/31116 |
| 2021/0043547 A1* | 2/2021 | Lin ................ | H01L 21/76898 |
| 2022/0302007 A1* | 9/2022 | Gangal ........... | H01L 24/16 |

* cited by examiner

*Primary Examiner* — Galina G Yushina

(74) *Attorney, Agent, or Firm* — Merchant & Gould P.C.

(57) ABSTRACT

A monolithic three dimensional integrated circuit is provided. The monolithic three dimensional integrated circuit includes a first cell layer having a first cell having a first active component of the monolithic three dimensional integrated circuit. A second layer having a second cell including a second active component. The second cell layer is formed vertically above the first cell layer. The first cell layer having the first active component and the second cell layer having the second active component are formed in a single die. The first cell has a smaller metal pitch than the second cell. A buried via electrically couples the first active component of the first cell of the first cell layer with the second active component of the second cell of the second cell layer.

19 Claims, 6 Drawing Sheets

MONOLITHIC THREE DIMENSIONAL INTEGRATED CIRCUIT

BACKGROUND

Historically, elements within an Integrated Circuits (IC) have all been placed in a single two dimensional (2D) active layer with elements interconnected through one or more metal layers that are also within the IC. While such circuits have generally become smaller according to Moore's Law, efforts to miniaturize ICs are reaching their limits in a 2D space and thus, design thoughts have moved to three dimensions. That is, current miniaturization techniques use three-dimensional (3D) integrated circuits (ICs) (3DICs) to achieve higher device packing density, lower interconnect delay, and lower costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

Figure 1:
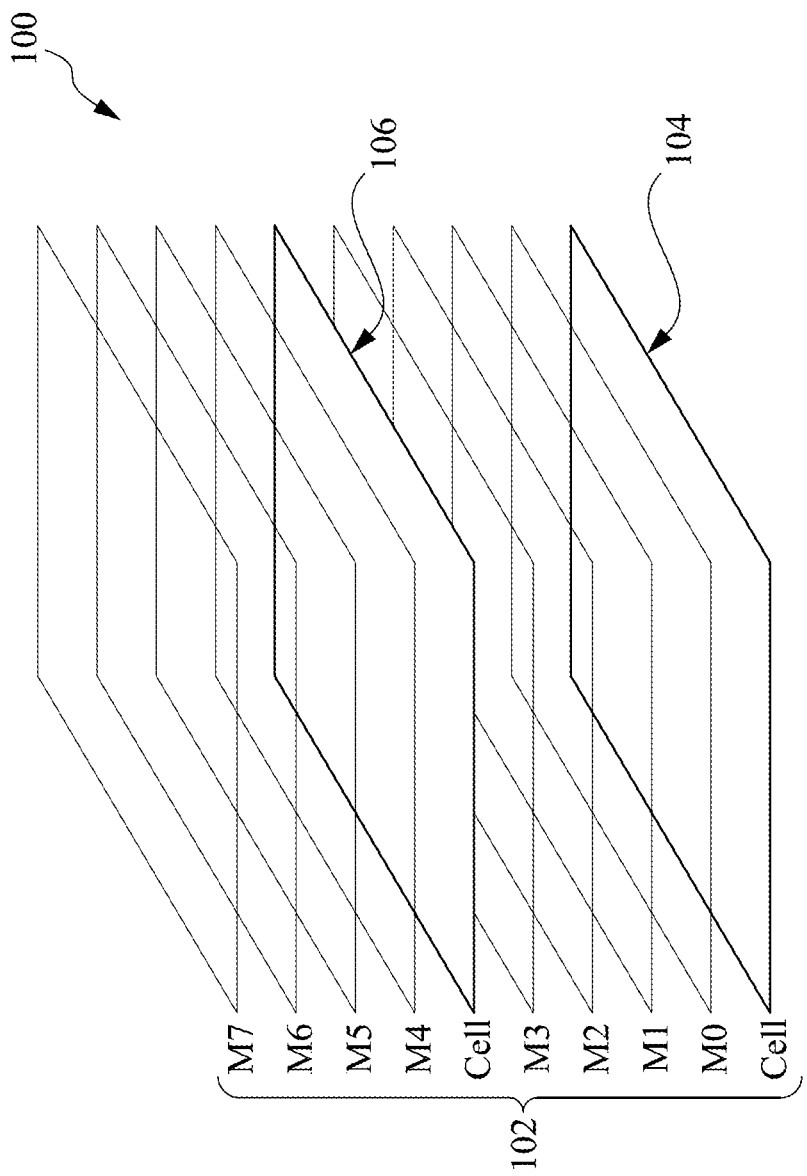
FIG. 1 illustrates an example block diagram of a monolithic three dimensional integrated circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Embodiments of the disclosure provide monolithic techniques to form three-dimensional (3D) integrated circuits (ICs) (also referred to as monolithic 3DIC) to miniaturize ICs. For example, the disclosed monolithic 3DICs offer vertical stacking of devices (including logic circuits) in a single die, with the potential to significantly reduce die area and increase die performance. For example, the monolithic 3DICs involve building electronic components and their connections within multiple tiers or multiple layers on a single die. Connections between the multiple tiers within the die are made with buried vias (BVs). Such BVs are much smaller in size than through silicon vias (TSVs) which are used in system in package (SIP) solutions that stack ICs atop one another. Smaller BVs allow 3DICs using BVs to achieve an integration density that is orders of magnitude higher than 3DICs employing TSVs.

In some embodiments, the layers of monolithic 3DIC are assembled through an ion-cutting process. The use of the layers in this fashion eliminates the need for precise alignment and TSVs. For example, in ion-cutting process, a receptor wafer is prepared with integrated components thereon. An oxide layer forms on a top surface of the receptor wafer. A donor wafer is prepared by subjecting the donor wafer to an ion (typically hydrogen) implantation process. The surface of the donor wafer with the ion implantation is then stacked onto the oxide layer of the receptor wafer. The oxide layer of the receptor wafer bonds with the surface of the donor wafer through an annealing process. The donor wafer is then removed, transferring a silicon layer to the receptor wafer. Additional electronic components and interconnects are fabricated over the transfer silicon layer sequentially. This approach is less expensive than epitaxial growth and eliminates the risk of misalignment, resulting in more functional devices than the techniques that rely on wafer-to-wafer, wafer-to-die, or die-to-die alignment.

FIG. 1 illustrates an example block diagram of a monolithic 3DIC 100 in accordance with some embodiments. As shown in FIG. 1, 3DIC 100 includes a die 102. Die 102 includes a plurality of cell layers, for example, a first cell layer 104 and a second cell layer 106. In some examples, first cell layer 104 and second cell layer 106 have approximately identical horizontal dimensions. In some other examples, first cell layer 104 is also referred to as first cell tier or a first cell level and second cell layer 106 is also referred to as a second cell tier or a second cell level. Although, monolithic 3DIC 100 of FIG. 1 is shown to include only two cell layers, that is, first cell layer 104 and second cell layer 106, it will be apparent to a person with ordinary skill in the art after reading this disclosure that monolithic 3DIC 100 of FIG. 1 can include more than two cell layers.

As shown in FIG. 1, die 102 includes a plurality of metal layers. For example, die 102 includes eight metal layers, for example, a zeroth metal layer M0, a first metal layer M1, a second metal layer M2, a third metal layer M3, a fourth metal layer M4, a fifth metal layer M5, a sixth metal layer M6, and a seventh metal layer M7. As referred to herein, the zeroth metal layer M0 is generally the lowest metal layer in 3DIC 100. That is, the zeroth metal layer M0 is the metal layer closest to a substrate on which the metal layers are formed. The first metal layer M1 is the metal layer formed above the zero metal layer M0 without any other metal layer between the zero metal layer M0 and the first metal layer M1. Likewise, the second metal layer M2 is the next metal layer formed above the first metal layer M1 without any other metal layer between the first metal layer M1 and the second metal layer M2. The progression of metal layers continues in this fashion until a top metal layer is formed, for example, the seventh metal layer M7 formed above the sixth metal layer M6 without any other metal layer between the sixth metal layer M6 and the seventh metal layer M7. It is to be understood that the disclosure is not limited to any specific number of metal layers. In some examples, the zeroth metal layer M0 is also referred to as a first metal layer M1 continuing to the seventh metal layer M7 which is also referred to as an eighth metal layer M8.

Continuing with FIG. 1, first cell layer 104 is located below the zeroth metal layer M0. However, in some examples, first cell layer 104 can be located between the zeroth metal layer M0 and the first metal layer M1, between the first metal layer M1 and the second metal layer M2, and so on. First cell layer 104 can include one or more cells. In some examples, the one or more cells of first cell layer 104 can form a logic circuit, a portion of a logic circuit, a logic function, a portion of a logic function, a functional element of a logic circuit, or a portion of a functional element of a logic circuit.

Second cell layer 106 is placed vertically above first cell layer 104. For example, second cell layer 106 is placed between the third metal layer M3 and the fourth metal layer M4. However, it will be apparent to a person with ordinary skill in the art that second cell layer 106 can be placed between another pair of metal layers, for example, between the fourth metal layer M4 and the fifth metal layer M5. Second cell layer 106 also includes one or more cells. In some examples, the one or more cells of second cell layer 106 can form a logic circuit, a portion of a logic circuit, a logic function, a portion of a logic function a functional element of a logic circuit, or a portion of a functional element of a logic circuit.

In some examples, one or more cells of first cell layer 104 and one or more cells of second cell layer 106 together can form a system on chip (SOC). In some other examples, first cell layer 104 and second cell layer 106 of monolithic 3DIC 100 are constructed to support different functionality and comply with differing design criteria. For example, monolithic 3DIC 100 can have one or more analog layers, digital layers, layers with higher voltage threshold, layers with lower leakage current, power supply layers, layers of different material to implement components that need different base materials and the like. In some examples, and unlike the stacked dies of system in package (SIP) arrangements, the upper layers of monolithic 3DIC 100, that is, second cell layer 106, may be the same size as the lower layers, that is, first cell layer 104 because no external wiring connections are required. By having the myriad layers within a single 3DIC 100, an entire system may be provided in a single IC and thus provide a system on chip (SOC).

Figure 2:
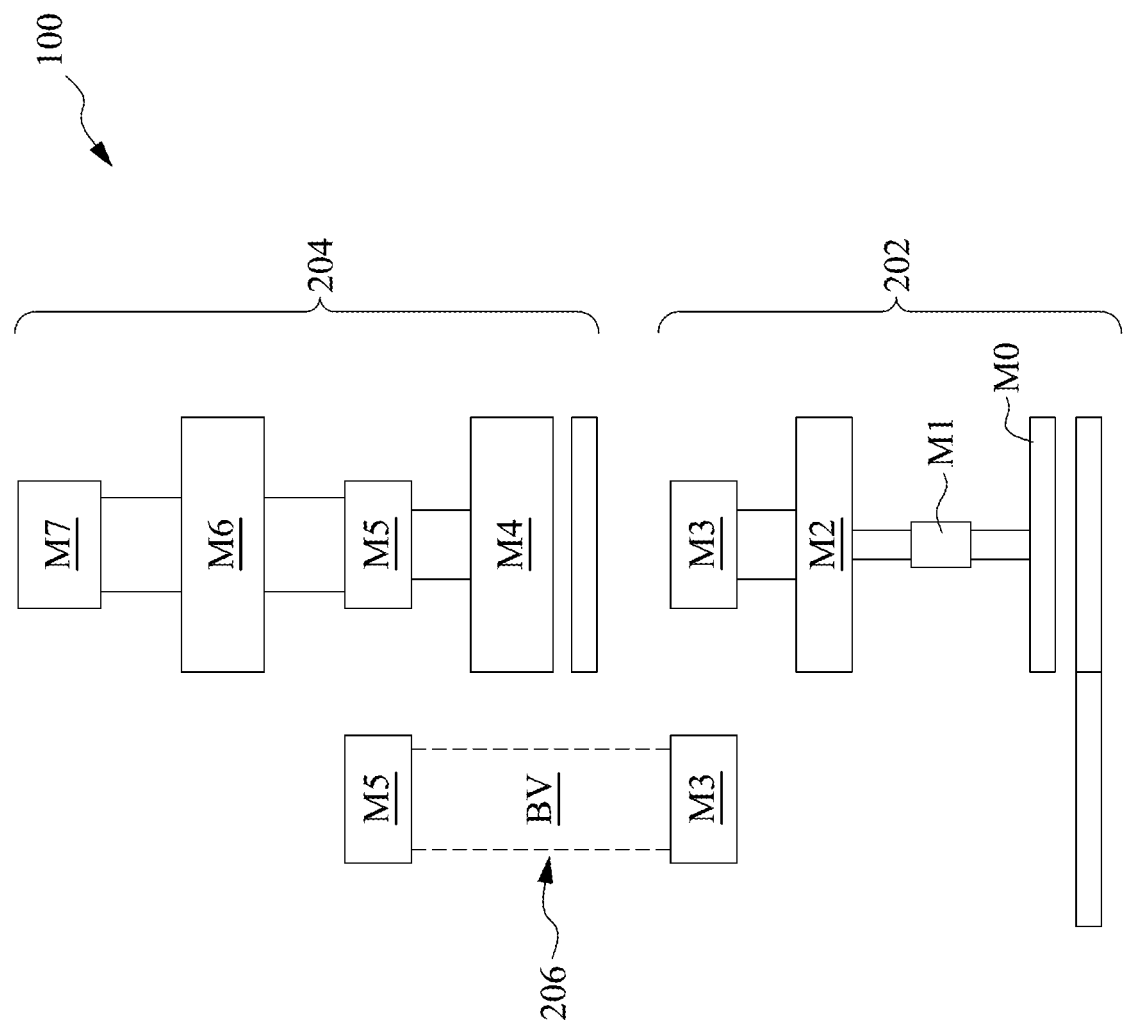
FIG. 2 illustrates another example block diagram of a monolithic three dimensional integrated circuit in accordance with some embodiments.

In some examples, one or more cells in first cell layer 104 can be connected with one or more cells of second cell layer 106 using one or more buried vias (BVs). FIG. 2 illustrates another example block diagram of monolithic 3DIC 100 in accordance with some embodiments. As shown in FIG. 2, monolithic 3DIC 100 includes a first cell 202, a second cell 204, and a buried via (BV) 206. In examples, first cell 202 is formed in first cell layer 104 and second cell 204 is formed vertically above first cell 202 in second cell layer 106. First cell 202 is electrically coupled with second cell 204 through BV 206. In some examples, BV 206 is much smaller in size than the previously described TSVs, thus allowing monolithic 3DIC 100 using BV 206 to achieve an integration density that is orders of magnitude higher than 3DICs employing TSVs.

In some examples, first cell 202 includes a first active component and second cell 204 includes a second active component. Each of the first active component and the second active component can include an entire device or portions of the entire device, such as a transistor, diode, capacitor, resistor, or inductor, or can include a group of several devices arranged to achieve some particular function, such as an inverter, a flip-flop, a memory cell, or an amplifier, among others.

In some examples, first cell 202 has a lower current leakage than second cell 204. In other examples, first cell 202 is optimized for a higher speed than second cell 204. In some other examples, first cell 202 and second cell 204 when electrically coupled form an integrated circuit or a functional circuit. The functional circuit can be at least one of: computation, digital processing, analog processing, radio frequency (RF) signal processing, analog/mixed signal processing, power management, sensor, power supply, battery, memory, digital logic, low leakage, low noise/high gain, clock, combinatorial logic, and sequential logic.

In some examples, first cell 202 is formed in first portion, that is, first four layers (that is, M0 to M3) of the eight metal layers of die 102 and second cell 204 is formed in the remaining four layers (that is, M4 to M7) of the eight metal layers of die 102. In other examples, first cell 202 is formed in zeroth metal layer M0 of die 102 and second cell 204 is formed in the fourth metal layer M4 of the eight metal layers of die 102. In such examples, local connectors of first cell 202 are formed in the first metal layer M1 of die 102 and global connectors of first cell 202 are formed in the second metal layer M2 and third metal layer M3. Similarly, local connectors for second cell 204 are formed in the fifth metal layer M5. In addition, global connectors for second cell 204 can be formed in the sixth metal layer M6 and the seventh metal layer M7.

In example embodiments, second cell 204 of monolithic 3DIC 100 is connected to first cell 202 through BV 206. For example, and as shown in FIG. 2, BV 206 connects a metal plate of first cell 202 formed in the third metal layer M3 with a metal plate of second cell 204 formed in the fifth metal layer M5. However, it will be apparent to a person with ordinary skill in the art after reading this disclosure that BV 206 can connect first cell 202 with second cell 204 by connecting the metal plates formed in other metal layers. For example, BV 206 can connect first cell 202 with second cell 204 by connecting a metal plate of second cell 204 formed in one of the fourth metal layer M4 or the fifth metal layer M5 with a metal plate of first cell 202 formed in one of the first metal layer M1, the second metal layer M2, or the third metal layer M3. In some examples, a metal type, a width, a height, and a thickness of BV 206 can depend on a cell type of each of first cell 202 and second cell 204 and may be different for a different type of cells.

In some examples, first cell layer 104 includes higher cost cells and second cell layer 106 includes lower cost cells. For example, a pitch of first cell 202 of first cell layer 104 is smaller than the pitch of second cell 204 of second cell layer 106. In addition, second cell layer 106 includes a fewer number of cells than first cell layer 104. In some examples, a ratio of number of cells in first cell layer 104 and second cell layer 106 can be predetermined.

Figure 3:
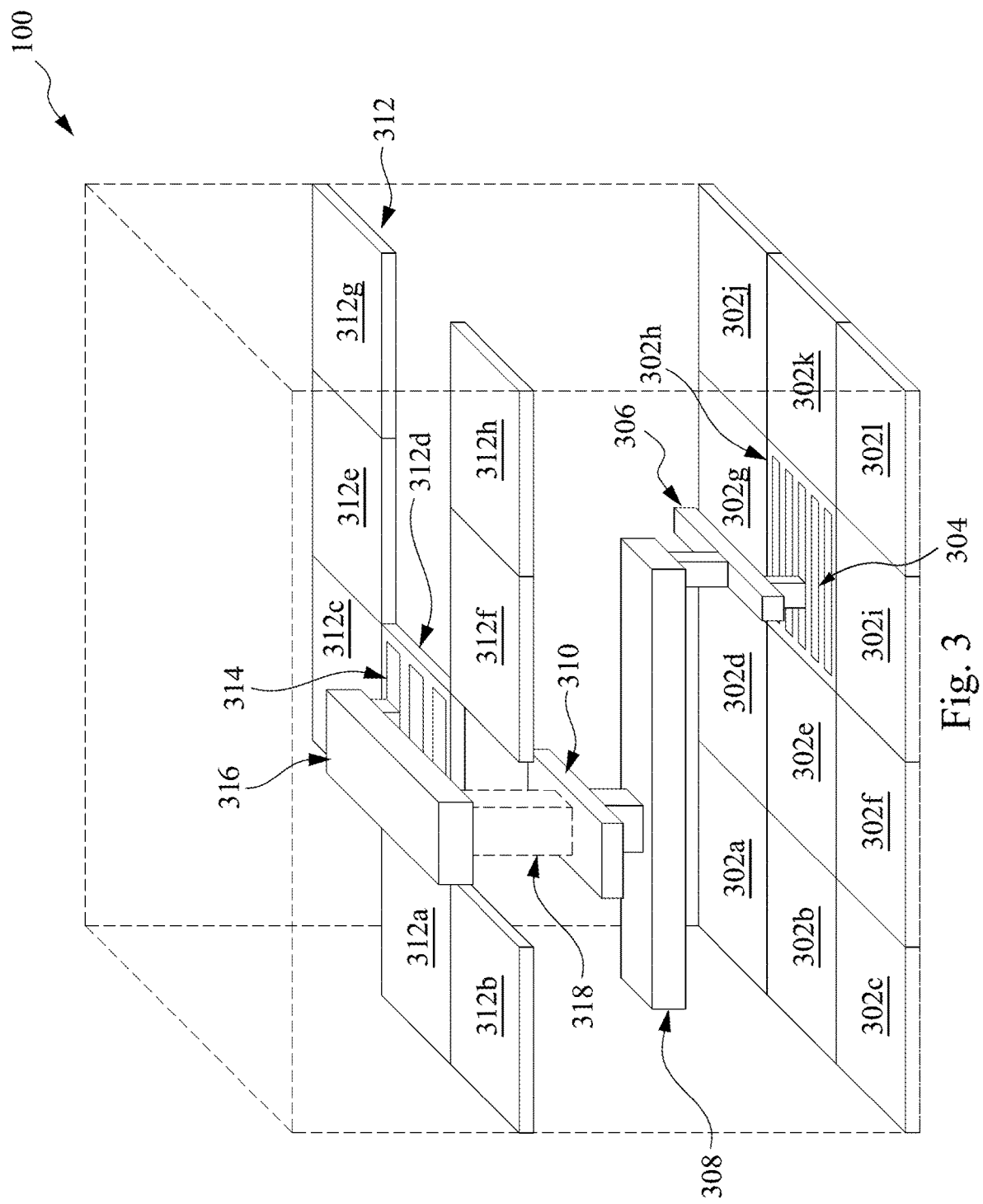
FIG. 3 illustrates an example three dimensional block diagram of a monolithic three dimensional integrated circuit in accordance with some embodiments.

FIG. 3 illustrates an example three dimensional block diagram of monolithic 3DIC 100 in accordance with some embodiments. As shown in FIG. 3, monolithic 3DIC 100 includes first substrate plates 302, zeroth metal plates 304, first metal plates 306, second metal plates 308, third metal plates 310, second substrate plates 312, fourth metal plates 314, fifth metal plates 316, and BV 318. In some examples, first substrate plates 302, zeroth metal plates 304, first metal plates 306, second metal plates 308, and third metal plates 310 can constitute first cell layer 104 or first cell 202. In some other examples, second substrate plates 312, fourth metal plates 314, and fifth metal plates 316 can constitute second cell layer 106 or second cell 204.

In some examples, and as shown in FIG. 3, first substrate plates 302 are formed below the zeroth metal layer M0 and zeroth metal plates 304 are formed in the zeroth metal layer M0. Moreover, first metal plates 306 are formed in the first metal layer M1 and second metal plates 308 are formed in the second metal layer M2. Furthermore, third metal plates 310 are formed in the third metal layer M3. In addition, second substrate plates 312 are formed between the third metal layer M3 and the fourth metal layer M4. Moreover, fourth metal plates 314 are formed in the fourth metal layer M4 and fifth metal plates 316 are formed in the fifth metal layer M5.

In some examples, first substrate plates 302 include a larger number of unit plates, and hence, a larger number of cells, than second substrate plates 312. For example, and as shown in FIG. 3, first substrate plates 302 include twelve unit plates (labeled as, 302a, 302b, 302c, 302d, 302e, 302f, 302g, 302h, 302i, 302j, 302k, and 302l) while second substrate plates 312 include eight unit plates (labeled as, 312a, 312b, 312c, 312d, 312e, 312f, 312g, and 312h). However, it will be apparent to a person with ordinary skill in the art after reading this disclosure that a different number of unit plates are foreseeable for both first substrate plates 302 and second substrate plates 312. In addition, although zeroth metal plates 304 are shown to be formed in unit plate 302h, it will be apparent to a person with ordinary skill in the art after reading this disclosure that zeroth metal plates 304 can be formed in any of unit plates labeled as 302a, 302b, 302c, 302d, 302e, 302f, 302g, 302h, 302i, 302j, 302k, and 302l. Moreover, although fourth metal plates 314 are shown to be formed in unit plate 312d, it will be apparent to a person with ordinary skill in the art after reading this disclosure that fourth metal plates 314 can be formed in any of unit plates labeled as 312a, 312b, 312c, 312d, 312e, 312f, 312g, and 312h.

In some examples, zeroth metal plates 304 have a shorter, a smaller pitch, or a denser pitch, and hence, a higher cost, than fourth metal plates 314. For example, and as shown in FIG. 3, zeroth metal plates 304 include five metal plates in an unit plate while fourth metal plates 314 include three metal plates in an unit plate. However, it will be apparent to a person with ordinary skill in the art after reading this disclosure that a different number of metal plates are possible in a unit plate for both zeroth metal plates 304 and fourth metal plates 314.

In examples, BV 318 connects fifth metal plates 316 with third metal plates 310. That is, BV 318 connects fifth metal plates 316 of second cell 204 with third metal plates 318 of first cell 202 thereby electrically coupling first cell 202 with second cell 204. In some examples, first metal plates 306 are also referred to as local routes for first cell 202 and can be used to connect one cell of one cell layer with another cell of the same cell layer. For example, the local routes are used for electrically coupling first cell 202 with another cell in first cell layer 104. In some other examples, second metal plates 308 and third metal plates 310 are also referred to as global routes of first cell 202 and can be used to connect one cell of one cell layer with another cell of another cell layer. For example, the global routes are used for electrically coupling first cell 202 with second cell 204 of second cell layer 106. In example embodiments, BV 318 is separated from second substrate plates 312 by a predetermined distance. In examples, BV 318 is similar to or substantially same as BV 206 of FIG. 2.

Figure 4:
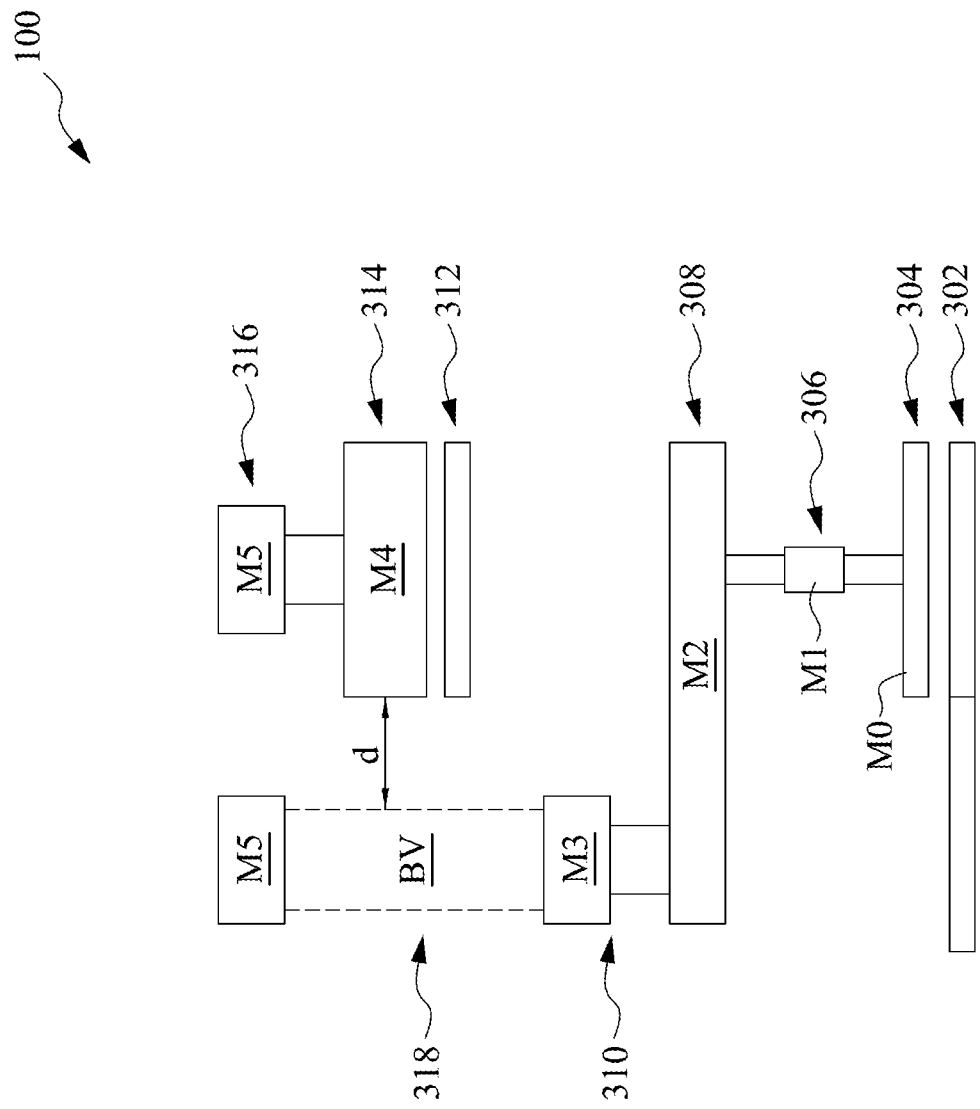
FIG. 4 illustrates an example cross-sectional view of the three dimensional block diagram of the monolithic three dimensional integrated circuit of FIG. 3 in accordance with some embodiments.

FIG. 4 illustrates an example cross-sectional view of the three dimensional block diagram of monolithic 3DIC 100 of FIG. 3 in accordance with some embodiments. As shown in FIG. 4, an edge of side of BV 318 is at least "d" distance apart from a closest edge or side of second substrate plates 312 (for example, unit plate 312 f). The "d" distance can be predetermined and may depend on a type of cells being connected by BV 118, types of materials used for forming each of BV 118, second substrate plates 112, fifth metal plates 316, and third metal plates 310.

Figure 5:
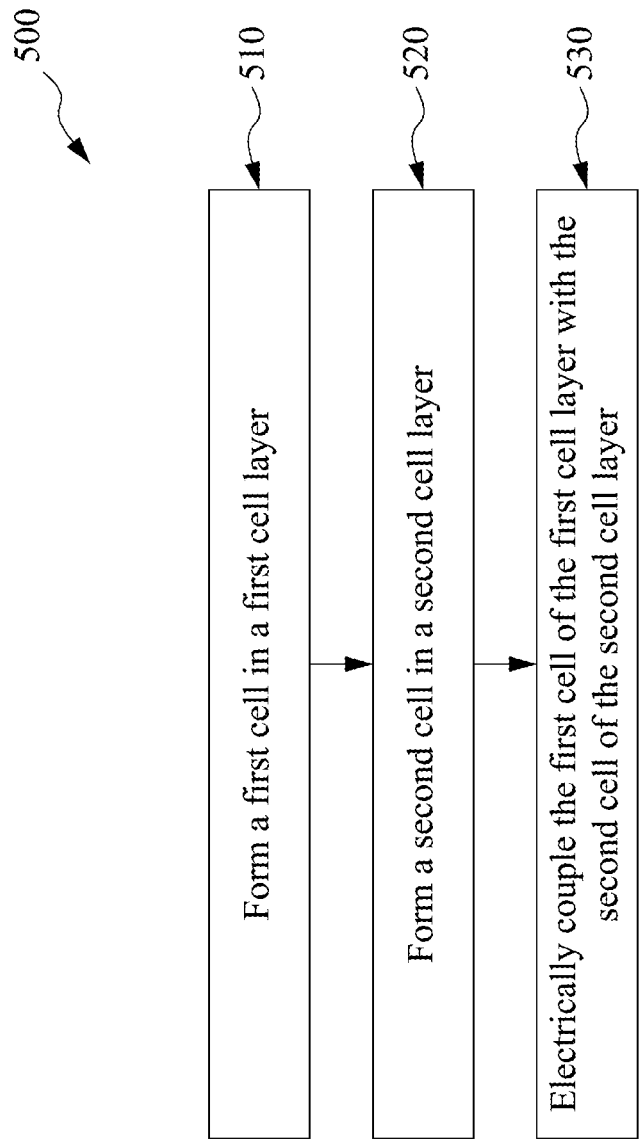
FIG. 5 illustrates a process flow for the method for forming a monolithic three dimensional integrated circuit in accordance with some embodiments.

FIG. 5 is a flowchart of a method 500 for forming monolithic three dimensional integrated circuit in accordance with some embodiments. For example, method 500 can be performed to form monolithic 3DIC 100 described above with reference to FIGS. 1-4 of the disclosure. The method 500 can be performed, for example, by a computer 600 as discussed with reference FIG. 6. In some embodiments, method 500 can be stored as instructions on a non-transitory computer readable medium which can be executed by a processor to perform method 500.

At block 510 of method 500, a first cell layer having a first cell is formed. For example, first cell layer 104 having first cell 202 is formed. In some examples, first cell 202 is formed in a first two metal layers of die 102 having eight metal layers. In some other examples, first cell 202 is formed in a first four metal layers of die 102 having eight metal layers.

At block 520 of method 500, a second cell layer having a second cell is formed. For example, second cell layer 106 having second cell 204 is formed. In some examples, second cell 204 is formed in a next two metal layers of die 102. That is, second cell 204 is formed in the fifth metal layers M4 and the sixth metal layer M5 of die 102. Second cell layer 106 is formed vertically above first cell layer 104.

At block 530 of method 500, the first cell of the first cell layer is electrically coupled with the second cell of the second cell layer through a buried via. For example, first cell 202 is electrically coupled to second cell 204 via BV 206. In some examples, first cell 202 and second cell 204 when electrically coupled can form monolithic 3DIC 100.

Figure 6:
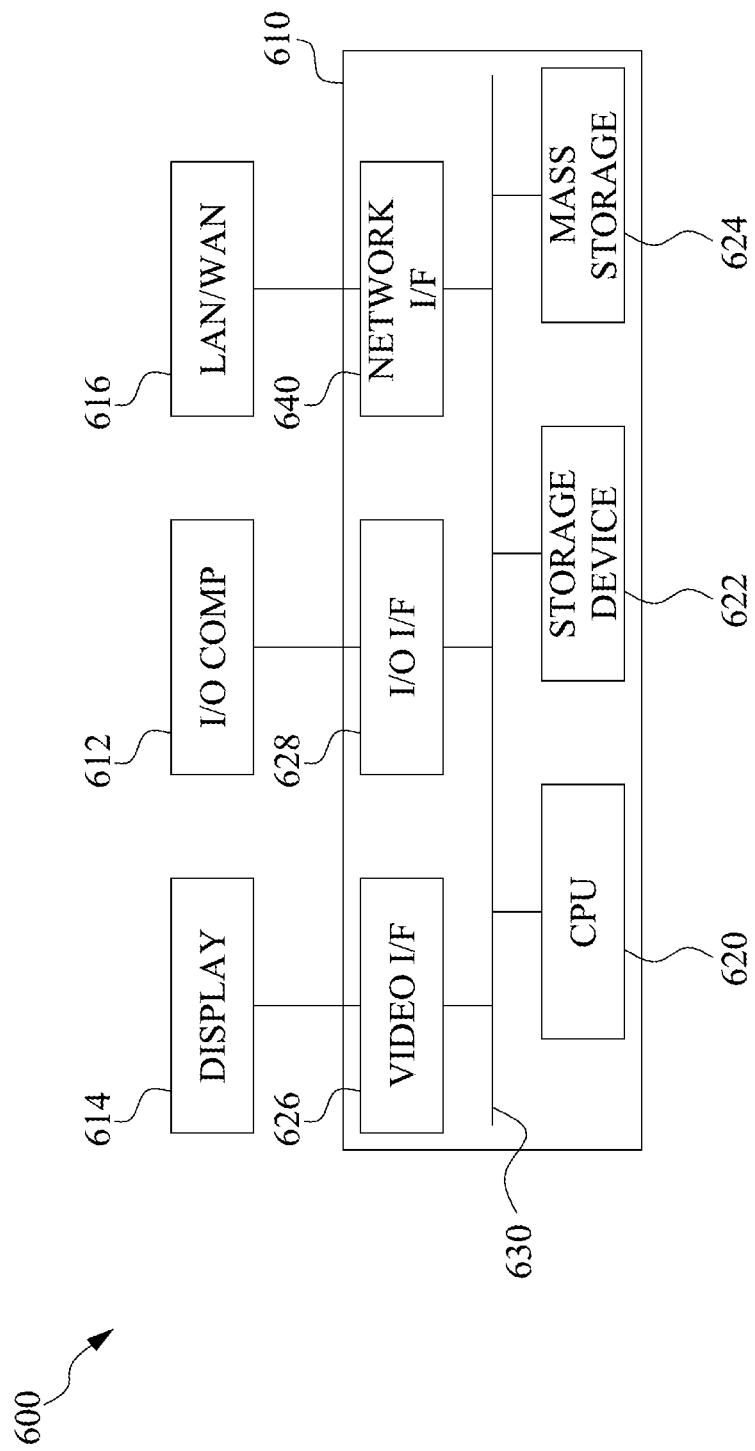
FIG. 6 is a block diagram illustrating an example of a processing system in accordance with some embodiments.

FIG. 6 is a block diagram illustrating an example of a processing system 600 in accordance with some embodiments disclosed herein. Processing system 600 may be used to form monolithic 3DIC 100 in accordance with various processes discussed herein. Processing system 600 includes a processing unit 610, such as a desktop computer, a workstation, a laptop computer, a dedicated unit customized for a particular application, a smart phone or tablet, etc. Processing system 600 may be equipped with a display 614 and one or more input/output devices 612, such as a mouse, a keyboard, touchscreen, printer, etc. Processing unit 610 also includes a processing unit (PU) 620, storage device 622, a mass storage device 624, a video adapter 626, and an I/O interface 628 connected to a bus 630.

Bus 630 may be one or more of any type of several bus architectures including a memory bus or memory controller, a peripheral bus, or video bus. PU 620 may comprise any type of electronic data processor, and storage device 622 may comprise any type of system memory, such as static random access memory (SRAM), dynamic random access memory (DRAM), or read-only memory (ROM).

Mass storage device 624 may comprise any type of storage device configured to store data, programs, and other information and to make the data, programs, and other information accessible via bus 630. Mass storage device 624 may comprise, for example, one or more of a hard disk drive, a magnetic disk drive, an optical disk drive, flash memory, or the like.

The term computer readable media as used herein may include computer storage media such as the system memory and storage devices mentioned above. Computer storage media may include volatile and nonvolatile, removable and non-removable media implemented in any method or technology for storage of information, such as computer readable instructions, data structures, or program modules. Storage device 622 and mass storage device 624 are computer storage media examples (e.g., memory storage).

Computer storage media may include RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by processing system 600. Any such computer storage media may be part of processing system 600. Computer storage media does not include a carrier wave or other propagated or modulated data signal.

Communication media may be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media.

Video adapter 626 and I/O interface 628 provide interfaces to couple external input and output devices to processing unit 610. As illustrated in FIG. 6, examples of input and output devices include display 614 coupled to video adapter 626 and I/O device 612, such as a mouse, keyboard, printer, and the like, coupled to I/O interface 628. Other devices may be coupled to processing unit 610, and additional or fewer interface cards may be utilized. For example, a serial interface card (not shown) may be used to provide a serial interface for a printer. Processing unit 610 also may include a network interface 640 that may be a wired link to a local area network (LAN) or a wide area network (WAN) 616 and/or a wireless link.

Embodiments of processing system 600 may include other components. For example, processing system 600 may include power supplies, cables, a motherboard, removable storage media, cases, and the like. These other components, although not shown, are considered part of processing system 600.

In some examples, instructions or software code is executed by PU 620 to perform refresh operations. The instructions or the software code may be accessed by PU 620 via bus 630 from storage device 622, mass storage device 624, or the like, or remotely through network interface 640. Further, in some examples, the refresh operations instructions may be received though I/O interface 628 and/or stored in storage device 622 or mass storage device 624 in accordance with various methods and processes implemented by the software code.

Disclosed embodiments thus provide a monolithic three-dimensional integrated circuit comprising: a first cell layer comprising a first cell having a first active component of a monolithic three dimensional integrated circuit; a second cell layer comprising a second cell having a second active component, wherein the second cell layer is formed vertically above the first cell layer, wherein the first cell layer having the first active component and the second cell layer having the second active component are formed in a single die, and wherein the first cell has a shorter metal pitch than the second cell; and a buried via electrically coupling the first active component of the first cell of the first cell layer with the second active component of the second cell of the second cell layer.

An accordance with other disclosed examples a monolithic three-dimensional integrated circuit comprising: a die comprising a plurality of metal layers; a first cell layer formed below a first metal layer of the plurality of metal layers of the die, the first cell layer comprising a first cell having a first active component; a second cell layer formed between a fourth metal layer and a fifth metal layer of the plurality of layers of the die, wherein the second cell layer comprises a second cell having a second active component, wherein the second cell layer is formed vertically above the first cell layer, and wherein the first cell has a shorter metal pitch than the second cell; and a buried via electrically coupling the first active component of the first cell of the first cell layer with the second active component of the second cell of the second cell layer.

In accordance with still further disclosed examples, a method of forming a monolithic three-dimensional integrated circuit comprises: forming a first cell layer comprising a first cell having a first active component; forming a second cell layer comprising a second cell having a second active component, wherein forming the second cell layer comprises forming the second cell layer vertically above the first cell layer, and wherein the first cell layer having the first active component and the second cell layer having the second active component are formed in a single die, and wherein the first cell has a shorter metal pitch than the second cell; and electrically coupling the first active component of the first cell of the first cell layer with the second active component of the second cell of the second cell layer through a buried via.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A monolithic three-dimensional integrated circuit comprising: a single die comprising eight metal layers disposed in a vertical direction, wherein the single die further comprises:
    a first cell layer formed below a zeroth metal layer of the eight metal layers of the single die, the first cell layer comprising a first cell having a first active component of the monolithic three-dimensional integrated circuit;
    a second cell layer formed in between a third metal layer and a fourth metal layer of the eight metal layers of the single die, the second cell layer comprising a second cell having a second active component, wherein the second cell layer is formed vertically above the first cell layer, wherein
    the second cell layer and the first cell layer have identical horizontal dimensions, and wherein
    both the first cell layer having the first active component and the second cell layer having the second active component are formed in the single die comprising the eight metal layers disposed in the vertical direction, and
    a buried via electrically coupling the first active component of the first cell of the first cell layer with the second active component of the second cell of the second cell layer, wherein
    the buried via connects the first cell with the second cell through a third metal layer and a fifth metal layer of the eight metal layers of the single die.

2. The monolithic three-dimensional integrated circuit of claim 1, wherein the first cell layer has a greater number of cells than the second cell layer.

3. The monolithic three-dimensional integrated circuit of claim 1, wherein the buried via is separated by a predetermined distance from a nearest edge of a substrate of the second cell.

4. The monolithic three-dimensional integrated circuit of claim 1, further comprising local routes for the first cell, wherein the local routes are formed in a first metal layer of the eight metal layers.

5. The monolithic three-dimensional integrated circuit of claim 1, further comprising global routes for the first cell, wherein the global routes connect the first cell with the second cell, and wherein the global routes for the first cell are formed in a second metal layer and the third metal layer of the eight metal layers.

6. The monolithic three-dimensional integrated circuit of claim 1, wherein the buried via is smaller in size than a through silicon via.

7. The monolithic three-dimensional integrated circuit of claim 1, wherein the first cell has a lower leakage current than the second cell.

8. A monolithic three-dimensional integrated circuit comprising:
    a single die comprising a plurality of metal layers disposed in a vertical direction, wherein the single die comprises:
        a first cell layer formed below a first metal layer of the plurality of metal layers of the die, the first cell layer comprising a first cell having a first active component;
        a second cell layer formed between a fourth metal layer and a fifth metal layer of the plurality of metal layers of the die, wherein the second cell layer comprises a second cell having a second active component, wherein the second cell layer is formed vertically above the first cell layer, wherein the second cell layer and the first cell layer have identical horizontal dimensions, and wherein the first cell has a smaller metal pitch than the second cell; and
    a buried via electrically coupling the first active component of the first cell of the first cell layer with the second active component of the second cell of the second cell layer, wherein the buried via connects the first cell with the second cell through a fourth metal layer and a sixth metal layer of the plurality of metal layers of the single die.

9. The monolithic three-dimensional integrated circuit of claim 8, wherein the first cell layer has a greater number of cells than the second cell layer.

10. The monolithic three-dimensional integrated circuit of claim 8, wherein the buried via is separated by a predetermined distance from a nearest edge of a substrate of the second cell.

11. The monolithic three-dimensional integrated circuit of claim 8, further comprising local routes for the first cell, wherein the local routes are formed in a first metal layer of eight metal layers.

12. The monolithic three-dimensional integrated circuit of claim 8, further comprising global routes for the first cell, wherein the global routes connect the first cell with the second cell, and wherein the global routes are formed in a third metal layer and the fourth metal layer of the plurality of eight metal layers.

13. The monolithic three-dimensional integrated circuit of claim 8, wherein the buried via is smaller in size than a through silicon via.

14. The monolithic three-dimensional integrated circuit of claim 8, wherein the first cell has a lower leakage current than the second cell.

15. A method of forming a monolithic three-dimensional integrated circuit, the method comprising:
    forming a first cell layer below a zeroth metal layer of a plurality of metal layers of a single die, the first cell layer comprising a first cell having a first active component;
    forming a second cell layer in between a third metal layer and a fourth metal layer of the plurality of metal layers of the single die, the second cell layer comprising a second cell having a second active component, wherein forming the second cell layer comprises forming the second cell layer vertically above the first cell layer, and wherein both the first cell layer having the first active component and the second cell layer having the second active component are formed in the single die comprising the plurality of metal layers disposed in a vertical direction; and electrically coupling the first active component of the first cell of the first cell layer with the second active component of the second cell of the second cell layer through a buried via, wherein the buried via connects the first cell with the second cell through a third metal layer and a fifth metal layer of the plurality of metal layers of the single die.

16. The method of claim 15, wherein the buried via is separated by a predetermined distance from a nearest edge of a substrate of the second cell.

17. The method of claim 15, wherein local routes for the first cell are formed in a first metal layer of the plurality of metal layers.

18. The method of claim 15, wherein the buried via is smaller in size than a through silicon via.

19. The method of claim 15, wherein the first cell has a lower leakage current than the second cell.

\* \* \* \* \*